(12) United States Patent
Derner et al.

(10) Patent No.: US 6,556,467 B2
(45) Date of Patent: Apr. 29, 2003

(54) GATE VOLTAGE TESTKEY FOR ISOLATION TRANSISTOR

(75) Inventors: Scott J. Derner, Meridian, ID (US); Scot M. Graham, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/942,207

(22) Filed: Aug. 29, 2001

(65) Prior Publication Data

US 2002/0118585 A1 Aug. 29, 2002

Related U.S. Application Data (63) Continuation of application No. 09/794,513, filed on Feb. 27, 2001, now Pat. No. 6,301,172.

(51) Int. Cl.[7] ................................................. G11C 5/02
(52) U.S. Cl. ............................. 365/51; 365/52; 365/72; 365/149
(58) Field of Search ............................. 365/51, 52, 63, 365/72, 149, 214

(56) References Cited

U.S. PATENT DOCUMENTS

| | | | |
|---|---|---|---|
| 4,570,244 A | 2/1986 | Sud et al. | |
| 5,500,815 A | * 3/1996 | Takase et al. | ............... 257/296 |
| 5,812,440 A | * 9/1998 | Suminaga et al. | .......... 365/104 |
| 5,946,250 A | 8/1999 | Suzuki | |
| 5,949,240 A | 9/1999 | Yeh | |
| 5,991,216 A | 11/1999 | Raad et al. | |
| 5,994,730 A | 11/1999 | Shrivastava et al. | |
| 6,043,562 A | 5/2000 | Siek | |
| 6,072,737 A | 6/2000 | Morgan et al. | |
| 6,081,461 A | 6/2000 | Shirley et al. | |

* cited by examiner

Primary Examiner—Richard Elms
Assistant Examiner—VanThu Nguyen
(74) Attorney, Agent, or Firm—Killworth, Gottman, Hagan & Schaeff LLP (57) ABSTRACT

A semiconductor memory architecture is provided where isolation between adjacent memory cell pairs is accomplished by using an isolation transistor incorporating a programmable gate voltage to minimize subthreshold leakage. A testkey is provided internal to the memory chip that can be enabled while the memory chip is in a test mode. The testkey is capable of testing the isolation transistors for excessive leakage. The testkey is coupled to a translator, responsible for converting control signals from the testkey to isolation gate voltages. The testkey is used to determine whether the isolation transistor is leaky. The translator may adjust the isolation gate voltage to turn the transistors off harder. The present invention may further include an antifuse to permanently change the isolation gate voltage to a suitable value when the semiconductor leaves the testing mode.

33 Claims, 9 Drawing Sheets

GATE VOLTAGE TESTKEY FOR ISOLATION TRANSISTOR

CROSS-REFERENCE TO RELATED APPLICATION

This is a continuation application of application Ser. No. 09/794,513 filed on Feb. 27, 2001 by Derner et al., now U.S. Pat. No. 6,301,172, entitled GATE VOLTAGE TESTKEY FOR ISOLATION TRANSISTOR.

BACKGROUND OF THE INVENTION

The present invention relates in general to a semiconductor device and in particular to a semiconductor device incorporating a gate voltage testkey for selectively programming isolation transistor gate voltage.

DRAM memory has enjoyed popular success over other types of memory technology because of its low cost and simple memory cell layout which promotes scalability. A DRAM memory cell is capable of storing one bit of information, and is constructed using only one memory cell transistor and one memory cell capacitor. As such, this memory cell is often referred to as a one-transistor one-capacitor (1T1C) cell. A collection of memory cells are grouped together in bitlines and wordlines, forming a memory array.

Figure 1:
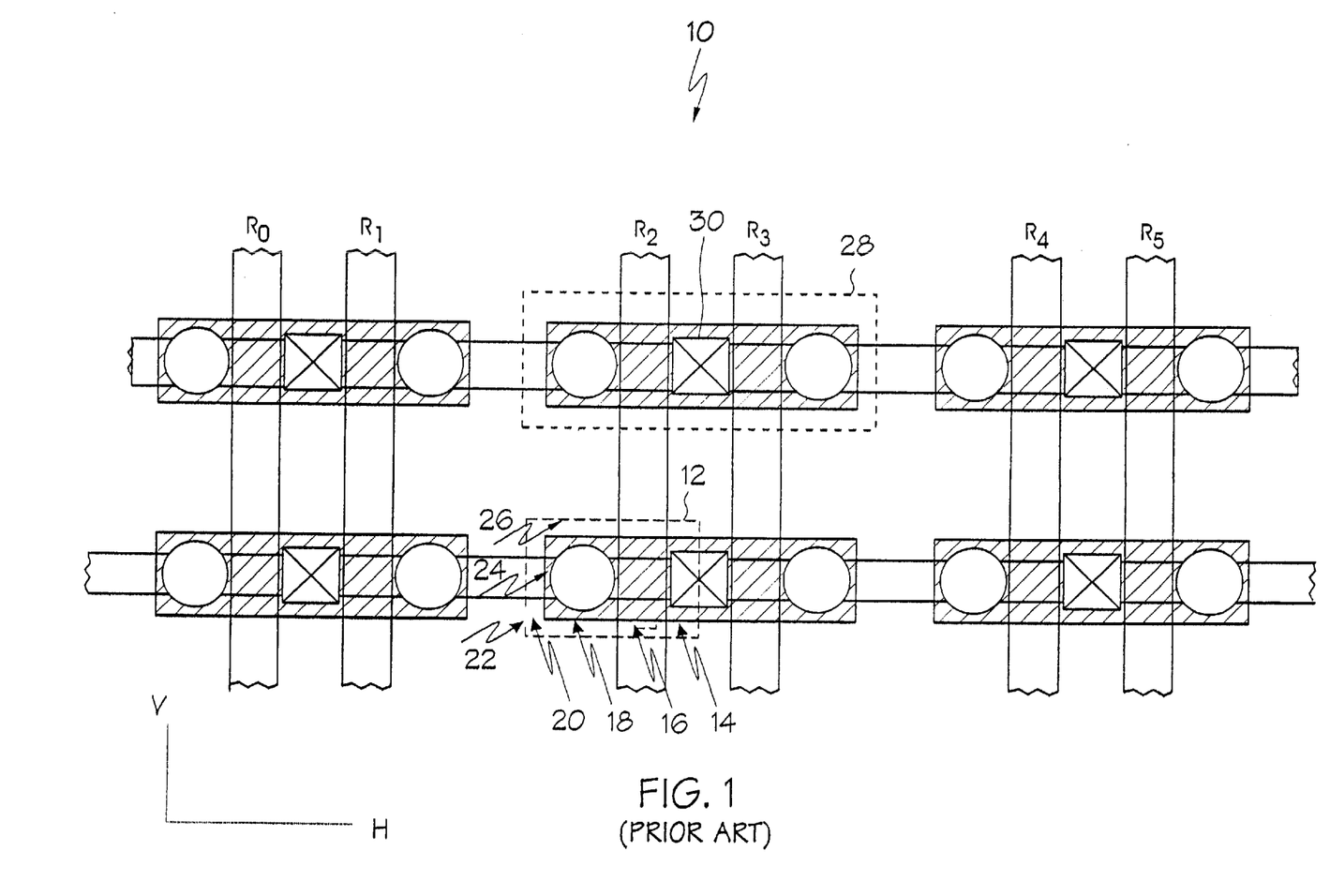
FIG. 1 is an illustration of a prior art open digitline memory array layout made up of aligned 6F@2 memory cells.

While device density in DRAM memory is limited by the resolution capability of available photolithographic equipment, it is also limited by the area consumed by each of the memory cells. Referring to FIG. 1, a memory structure 10 is comprised of a plurality of memory cells 12. As identified herein, the minimum area of a memory cell 12 is defined with reference to a feature dimension (F) which refers to the dimension that is half the wordline WL pitch (width plus space) or half the digitline DL pitch (width plus space). To illustrate the determination of cell area, a box is drawn around the memory cell 12. Along the horizontal axis H of the memory cell 12, the box includes one-half digitline contact feature 14, one wordline feature 16, one capacitor feature 18 and one-half field oxide feature 20, totaling three features. Along the vertical axis V of the memory cell 12, the box contains one half field oxide feature 22, one active area feature 24, and a second half oxide feature 26 totaling two features. The structure of the memory cell 12 results in its area being 3F.multidot.2F or 6FSupp2. To conserve space on a die, memory cell pairs 28 are defined by adjacent memory cells 12 that share a single bitline contact 30.

Figure 2:
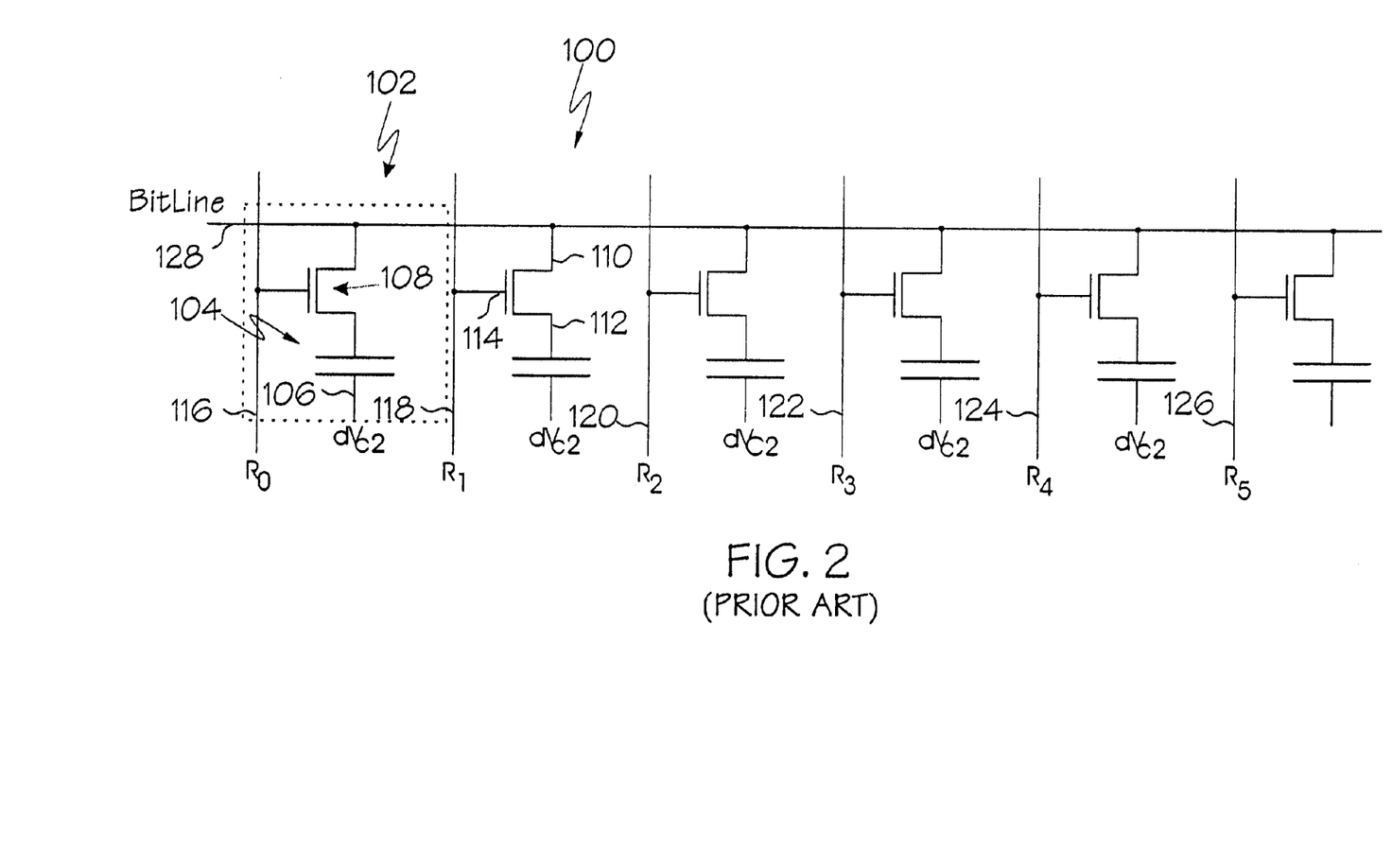
FIG. 2 is a schematic illustration of a prior art open digitline memory array according to FIG. 1.

While the 6 Fsupp2 array may be implemented as an open bitline as well as a folded bitline, early memory devices incorporated the open bitline configuration. In the open bitline architecture, each wordline connects to memory cell transistors on every bitline. This is sometimes referred to as a crosspoint style array. Referring to FIG. 2, a memory structure 100 is illustrated for an open digitline architecture. The memory structure 100 includes a plurality of memory cells 102. Each memory cell 102 is comprised of a capacitor 104, having a common node 106 biased at a voltage of Vcc/2 volts. The capacitor 104 typically represents a binary logic level one by a charge of +Vcc/2 volts, and a binary logic level zero by a charge of −Vcc/2 volts. Each memory cell 102 is further comprised of a transistor 108 having a first source/drain region 110, a second source/drain region 112, and a gate 114. The gate 114 of each transistor 108 connects to a wordline (WL) 116, 118, 120, 122, 124 and 126. Further, the first source/drain region 110 of each transistor 108 connects to a bitline (BL) 128.

As demands for higher capacity memory devices continue to increase, memory cells are placed closer together. However, where memory cells of a conventional 6 Fsupp2 array are packed too closely, adjacent memory cells may be affected by subthreshold leakage. Excessive subthreshold leakage may affect data integrity. In an attempt to resolve the problems that are attributable to the conventional 6 Fsupp2 array, the industry adopted an 8 Fsupp2 array where improved noise performance is realized by providing a twisted configuration. The 8 Fsupp2 memory array is created by tiling a selected quantity of memory cells together such that memory cells along a given bitline do not share a common wordline and such that memory cells along a common wordline do not share a common bitline. Any given wordline forms a memory cell transistor on alternating bitlines. This structure allows the formation of bitline pairs and ensures that wordline activation enables transistors only on alternate bitlines. Further, the 8 Fsupp2 provides improved noise performance, which is derived from the adjacency of true and complement bitlines and the capability to twist these bitline pairs. However, since the wordlines have to pass alternate memory cells as field poly, the size is increased by approximately 25%, or by 2 features. As such, the 8 Fsupp2 array does not provide the same degree of packing density seen in the 6 Fsupp2 array described above. As the demand for memory devices with larger capacity continues to increase, the larger array size provided by the 8 Fsupp2 array become a limiting factor.

For the reasons stated above, and for other reasons stated below which will become apparent to those skilled in the art upon reading and understanding the present specification, there is a need in the art for a 6 Fsupp2 area array with improved subthreshold leakage characteristics, which allows for a higher packing density thus more densely populated memories.

SUMMARY OF THE INVENTION

The present invention overcomes the disadvantages of previously known 6 Fsupp2 array architectures by providing a programmable gate voltage to minimize subthreshold leakage of an isolation transistor positioned between adjacent memory cells.

The memory cell is thoroughly tested using a testkey device, which is capable of testing different isolation gate voltages on the fly, without the need to create a reticle to change the gate voltage. The testkey is such that a fair comparison of data collected from the same array space can be realized. Further, upon determining that the measured subthreshold leakage for a particular bit is excessive, the isolation transistor gate can be permanently changed from ground, or zero volts to the back bias voltage (Vbb), or some other voltage more negative than ground to effectively shut the transistor off harder. The testkey may selectively test alternative negative potentials, until the subthreshold leakage is brought within satisfactory parameters. Once the required isolation gate potential has been determined, it may optionally be permanently programmed to that potential, using an antifuse device.

In a first embodiment of the present invention, a memory device has an array of storage cells having a plurality of selectively addressable memory cells coupled to a bitline, and isolation devices positioned to prevent leakage between the plurality of selectively addressable memory cells, each of the isolation devices having an isolation control. A test circuit is coupled to the array of storage cells, and is capable of determining characteristics of the isolation devices. A translator is coupled to the test circuit, and has a bias control coupled to each of the isolation controls. The translator is programmable to provide one of at least two bias signals to the isolation controls.

Preferably, the isolation device comprises an isolation transistor, and the isolation control comprises a gate of the isolation transistor. Under this arrangement, the translator bias control is coupled to the gate of the isolation transistor, and the translator is programmable to provide one of at least two voltages to the gate of the isolation transistors, each of the at least two voltages are biased to turn off the isolation transistors. The present embodiment can be realized in a 6 Fsupp2 array, in an open or closed bitline architecture where the array of storage cells further comprises a plurality of bitlines, and the plurality of selectively addressable memory cells further comprises a plurality of adjacent storage cell pairs connected to each of the plurality of bitlines, and the isolation transistors are positioned to provide isolation between each of the plurality of adjacent storage cell pairs.

While the chip is in the test mode, the testkey is capable of determining the isolation gate voltage needed for the isolation transistors to remain off. When the chip is not being tested, a device such as an antifuse device coupled to the translator and to the test circuit can be used to permanently select one of the at least two bias signals.

In a second embodiment of the present invention, an array of storage cells have a plurality of bitlines, a plurality of adjacent storage bit pairs coupled to each of the plurality bitlines, and isolation transistors positioned to prevent leakage between each of the plurality of adjacent storage bit pairs. A test circuit is coupled to the array of storage cells, which is used to determine the characteristics of the isolation transistors, including the leakage of the isolation transistors. A translator is coupled to the test circuit, and has a bias control coupled to each of the gates of the isolation transistors. The translator is programmable to provide one of at least two voltages to the gate of the isolation transistors, each of the at least two voltages biased to turn off the isolation transistors. An antifuse device may optionally be coupled to the translator. The antifuse device is programmable to select one of the at least two bias signals when the memory device is not in a test mode.

In yet another embodiment of the present invention, an array of storage cells have a plurality of bitlines, a plurality of adjacent storage bit pairs coupled to each of the plurality bitlines, and isolation transistors positioned to prevent leakage between each of the plurality of adjacent storage bit pairs. A test circuit is coupled to the array of storage cells, and is used to determine the characteristics of the isolation transistors. A translator is coupled to the test circuit, and has a bias control coupled to each of the gates of the isolation transistors. The translator is programmable to provide one of at least two voltages to the gate of the isolation transistors, each of the at least two voltages biased to turn off the isolation transistors. Further, an antifuse device is coupled to the translator, the antifuse device programmable to select one of the at least two bias signals. The circuit is configured such that the bias control of the translator is adjustable by the test circuit while the memory device is in a test mode, and the bias control is held at a fixed one of the at least two voltages when the memory device is out of the test mode by the antifuse.

In yet another embodiment of the present invention, an isolation gate biasing circuit in an embedded DRAM has a test circuit programmable to send, receive and compare at least one data test signal to a plurality of addressable memory cells, the plurality of addressable memory cells having isolation transistors between adjacent ones of the plurality of addressable memory cells, the test circuit used to determine isolation transistor characteristics. Further, a translator is coupled to the test circuit and is programmable to bias a gate on each of the isolation transistors to any one of at least two voltages, each of the at least two voltages biased to turn off the isolation transistors. Preferably, the test circuit is operable to program the translator to bias the gates of the isolation transistors to a select one of the at least two voltages on the fly.

The test circuit further comprises a test mode configured to allow the test circuit to program the translator only when the test mode is active. Optionally, the isolation gate biasing circuit further has an antifuse array coupled to the translator, the antifuse array being permanently programmable such that, once programmed, the translator is permanently programmed to a select one of the at least two voltages.

In yet another embodiment of the present invention, an isolation gate biasing circuit in an embedded DRAM comprises a test circuit programmable to send, receive and compare at least one data test signal to a plurality of addressable memory cells. The plurality of addressable memory cells have isolation transistors between adjacent ones of the plurality of addressable memory cells, and the test circuit is capable of determining isolation transistor leakage. A translator is programmable to bias a gate on each of the isolation transistors to any one of at least two voltages, each of the at least two voltages biased to turn off the isolation transistors, and a programmable antifuse array is coupled to the translator. The translator is programmable by the test circuit on the fly, while the isolation gate biasing circuit is in a test mode, and the translator is controlled by the antifuse array to bias the isolation transistors at a fixed one of the at least two voltages when the isolation gate biasing circuit is out of the test mode.

In a further embodiment of the present invention, a method of reducing subthreshold leakage in an isolation transistor positioned to prevent leakage between adjacent cells in an open digitline memory architecture comprises the steps of setting an isolation gate voltage to a first voltage. The next step involves applying the isolation gate voltage to a gate of the isolation transistor, measuring a subthreshold leakage of the isolation transistor and comparing the subthreshold leakage to a desired subthreshold leakage. The next step includes setting the isolation gate voltage to a second voltage if the subthreshold leakage is greater than the desired subthreshold leakage.

The method of reducing subthreshold leakage may optionally include the steps of re-measuring the subthreshold leakage if the isolation gate voltage is set to the second voltage, and comparing the re-measured subthreshold leakage to the desired subthreshold leakage. The chip may provide a failure signal if the re-measured subthreshold leakage exceeds the desired subthreshold leakage. Further, the step of permanently programming the isolation gate voltage when the subthreshold leakage is less than the desired subthreshold leakage may be realized. Preferably, the first voltage is zero volts, and the second voltage is a back bias voltage, the second voltage being more negative than the first voltage. The first and second voltages are set using a translator, and using a testkey to control the translator and further to measure the subthreshold leakage.

In yet another embodiment of the present invention, a semiconductor circuit comprises a first transistor having a gate, a first source/drain region, and a second source/drain region, a second transistor having a gate, a first source/drain region, and a second source/drain region and a first isolation transistor having a gate, a first source/drain region, and a second source/drain region. A first bitline is coupled to the first source/drain region of the first transistor, while a first wordline coupled to the gate of the first transistor. A first capacitor couples a first reference voltage to the second source/drain region of the first transistor. The first source/drain region of the isolation transistor is coupled to the second source/drain region of the first transistor, while the second source/drain region of the isolation transistor is coupled to the first source/drain region of the second transistor. A second capacitor couples the first reference voltage to the first source/drain region of the second transistor. The first bitline is further coupled to the second source/drain region of the second transistor, and a second wordline is coupled to the gate of the second transistor. A translator is coupled to the gate of the first isolation transistor. The translator is programmable to provide one of at least two voltages to the gate of the first isolation transistor, each of the at least two voltages biased to turn off the first isolation transistor.

The first isolation transistor is preferably an n-channel transistor. Under this arrangement, it is preferable that the at least two voltages of the translator further comprise a first voltage of zero volts, and at least one negative voltage. More preferably, the at least two voltages of the translator further comprise a first voltage of zero volts, and a second voltage equal to the semiconductor circuit back bias voltage. Optionally, the at least two voltages of the translator may further comprise a first voltage of zero volts, and a second voltage equal to the semiconductor circuit back bias voltage, and at least one voltage between the first voltage and the second voltage.

The semiconductor circuit may optionally include a test mode logic coupled to the translator for selectively programming the at least two voltages of the translator, and may further include at least one antifuse coupled to the translator, the at least one antifuse capable of permanently programming the translator.

In yet another embodiment of the present invention, a semiconductor circuit comprises a first transistor having a gate, a first source/drain region, and a second source/drain region, a second transistor having a gate, a first source/drain region, and a second source/drain region and a first isolation transistor having a gate, a first source/drain region, and a second source/drain region, the first isolation transistor being an n-channel transistor. A first bitline is coupled to the first source/drain region of the first transistor, a first wordline is coupled to the gate of the first transistor, and a first capacitor couples a first reference voltage to the second source/drain region of the first transistor. The first source/drain region of the isolation transistor is coupled to the second source/drain region of the first transistor, and the second source/drain region of the isolation transistor is coupled to the first source/drain region of the second transistor. A second capacitor couples the first reference voltage to the first source/drain region of the second transistor, the first bitline is coupled to the second source/drain region of the second transistor, and a second wordline is coupled to the gate of the second transistor. A translator is coupled to the gate of the first isolation transistor, the translator being programmable to provide one of at least two voltages to the gate of the first isolation transistor, each of the at least two voltages biased to turn off the first isolation transistor. Further, a testkey logic circuit is coupled to the translator for selectively programming the at least two voltages of the translator when the semiconductor circuit is in a test mode and at least one antifuse is coupled to the translator. The at least one antifuse selects one of the at least two voltages when the semiconductor circuit is out of the test mode. Under this arrangement, the at least two voltages of the translator further comprise a first voltage of zero volts, and a second voltage equal to the semiconductor circuit back bias voltage.

In another embodiment of the present invention, a semiconductor chip has an open bitline memory array. The open bitline memory array has a plurality of bitlines, a plurality of memory cell pairs coupled to each of the plurality of bitlines, an isolation transistor positioned to prevent leakage between adjacent ones of the plurality of memory cell pairs. A testkey is coupled to the open bitline memory array capable of determining isolation leakage, and a translator is coupled to each of the gates of the isolation transistors, the translator providing one of at least two voltages to the gates, each of the at least two voltages biased to turn off the isolation transistors. The testkey is capable of programming the translator between any one of the at least two voltages on the fly, while the semiconductor chip is in a test mode, and the testkey programs the translator to a fixed one of the at least two voltages while the semiconductor chip is out of the test mode.

Preferably, the isolation transistors are n-channel isolation transistors, and the at least two voltages comprises a first voltage of zero volts, and a second voltage of a back bias voltage, the back bias voltage being more negative than zero volts. Optionally, the at least two voltages comprises a first voltage of zero volts, a second voltage of a back bias voltage, the back bias voltage being more negative than zero volts, and at least one voltage between the first and second voltages. Each of the gates of the isolation transistors are connected to any one of the at least two voltages from the translator. The isolation transistor gate voltages need not be identical throughout the memory array.

In yet another embodiment of the present invention, a computer system is provided, the computer system comprising a processor, an input device coupled to the processor, an output device coupled to the processor, an address bus coupled to the processor, a data bus coupled to the processor and a memory device coupled to the processor. The memory device includes a first bitline, a first wordline, and a second wordline. A first memory cell has a first transistor having a gate coupled to the first wordline, a first source/drain region coupled to the first bitline, and a second source/drain region. A first capacitor couples a first reference voltage to the second source/drain region of the first transistor. A second memory cell has a second transistor having a gate coupled to the second wordline, a first source/drain region coupled to the first bitline, and a second source/drain region. A second capacitor couples the first reference voltage to the second source/drain region of the second transistor. A first isolation transistor has a gate, a first source/drain region coupled to the second source/drain region of the first transistor, and a second source/drain region coupled to the second source/drain region of the second transistor. A translator has a translator output coupled to the gate of the first isolation transistor, and a test circuit is coupled to the translator. The test circuit is arranged to program the translator to provide one of at least two voltages to the translator output, each of the at least two voltages biased to turn off the first isolation transistor.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings which form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

Figure 3:
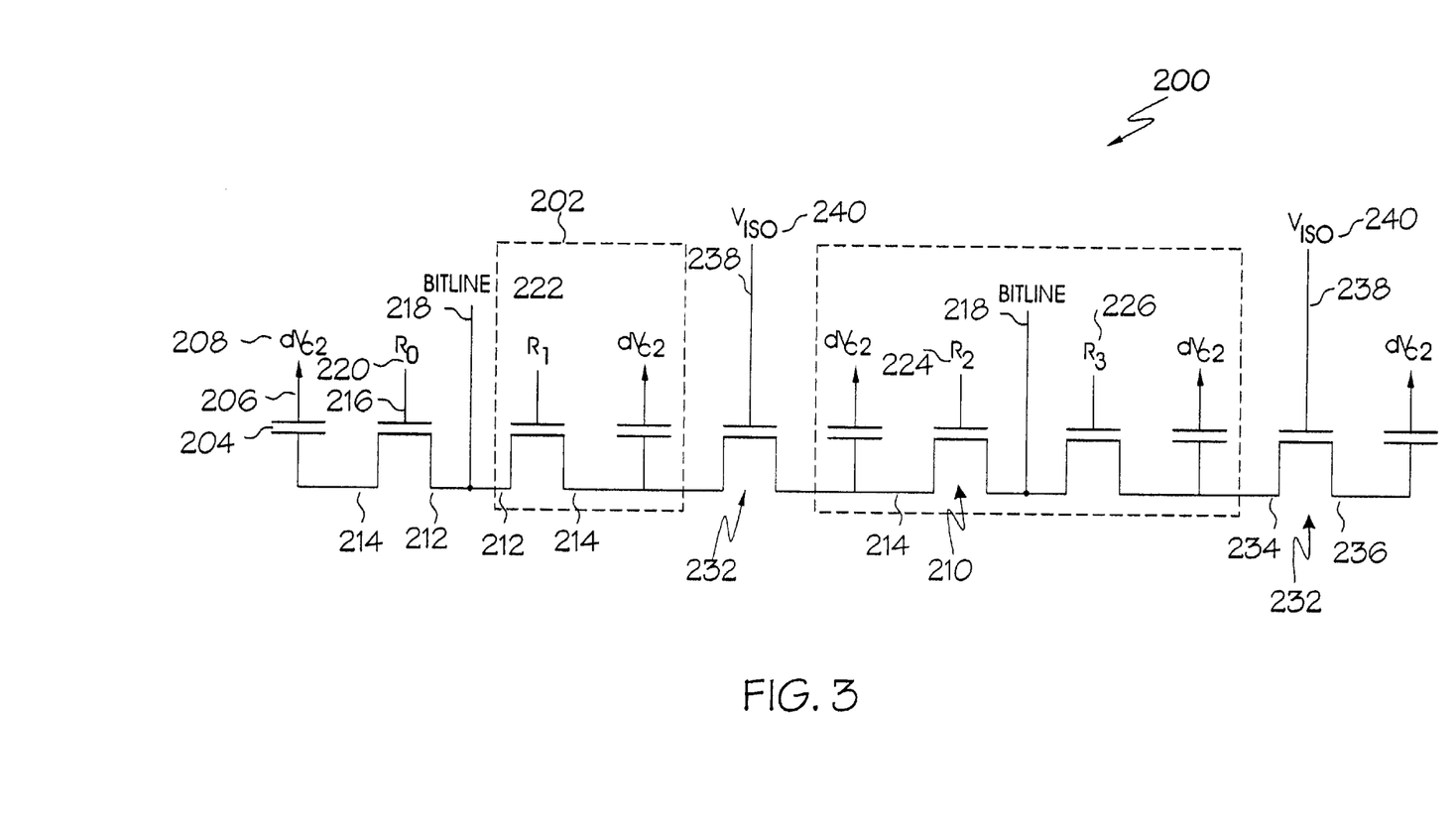
FIG. 3 is a schematic illustration of the 6 Fsupp2 memory architecture according to the present invention.

Referring to FIG. 3, an embodiment of the present invention is illustrated. The memory structure 200 includes a plurality of memory cells 202. Each memory cell 202 comprises a memory cell capacitor 204 having a common node 206 connected to the cell plate common node voltage (dvc2) 208. The memory cell further comprises a memory cell transistor 210 having a first source/drain region 212, a second source/drain region 214, and a gate 216. The first source/drain region 212 of each memory cell transistor 210 connects to bitline 218. The second source/drain region 214 connects to the memory cell capacitor 204. The gate 216 of each memory cell transistor 210 connects to a unique wordline 220, 222, 224, and 226. Isolation is provided between adjacent memory cells 202 by isolation transistors 232. Each isolation transistor 232 has a first source/drain region 234, a second soured/drain region 236 and a gate 238. The first and second source/drain regions 234, 236 of the isolation transistors 232 are coupled to the second source/drain regions 214 of adjacent ones of memory cell transistors 210 of memory cells 202. The gates 238 of the isolation transistors 232 are coupled to the reference voltage Viso 240.

The gates 238 of the isolation transistors 232 tied to reference voltage Viso 240. The reference voltage Viso 240 is biased to turn the isolation transistors 232 off. Typically, this is accomplished by tying the reference voltage Viso 240 to zero volts or ground potential. Where leakage of the isolation transistor 232 exceeds predetermined parameters, the isolation transistor 232 can be turned off "harder" by setting the reference voltage Viso 240 to a voltage more negative than ground as more fully described herein. The isolation transistor 232 is provided to prevent leakage between adjacent memory cells 202. Therefore, while illustrated as lying between adjacent memory cells 202, it should be appreciated that the isolation transistor 232 can be applied anywhere on the die calculated to prevent leakage effects of one memory cell 202 to the next.

Figure 4:
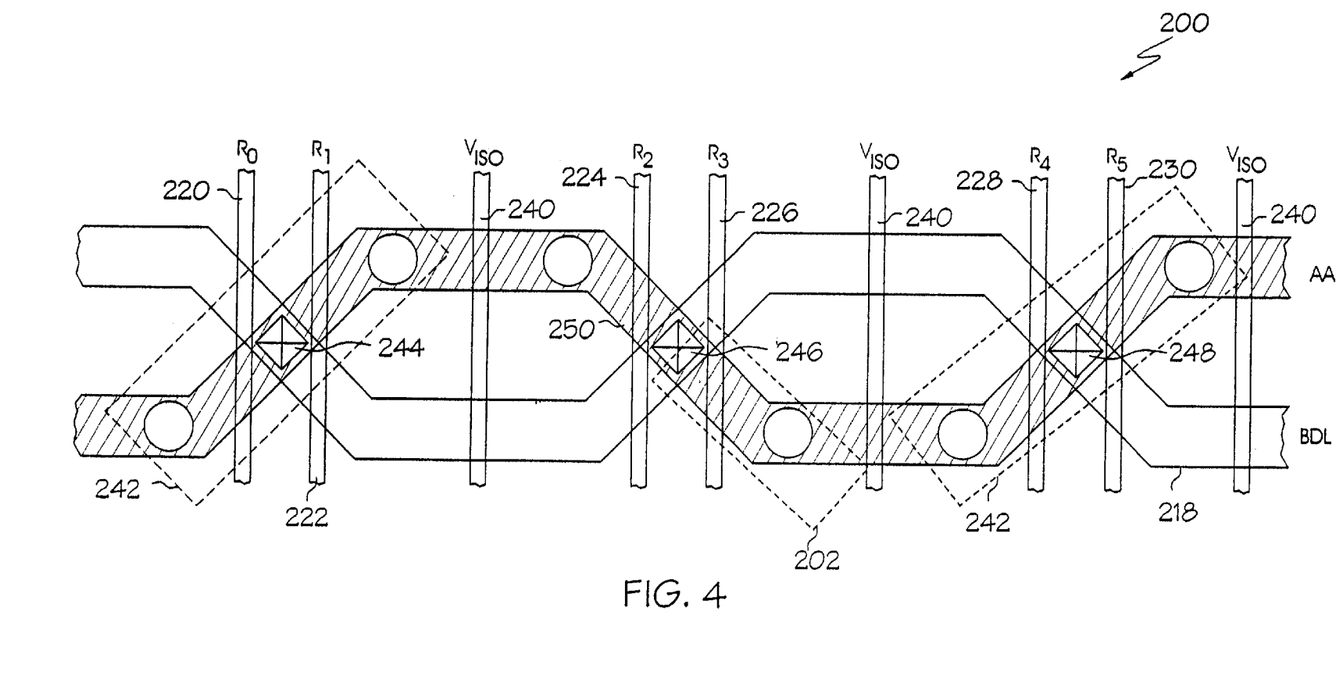
FIG. 4 is an illustration of the 6 Fsupp2 architecture layout according to the present invention.
Figure 5:
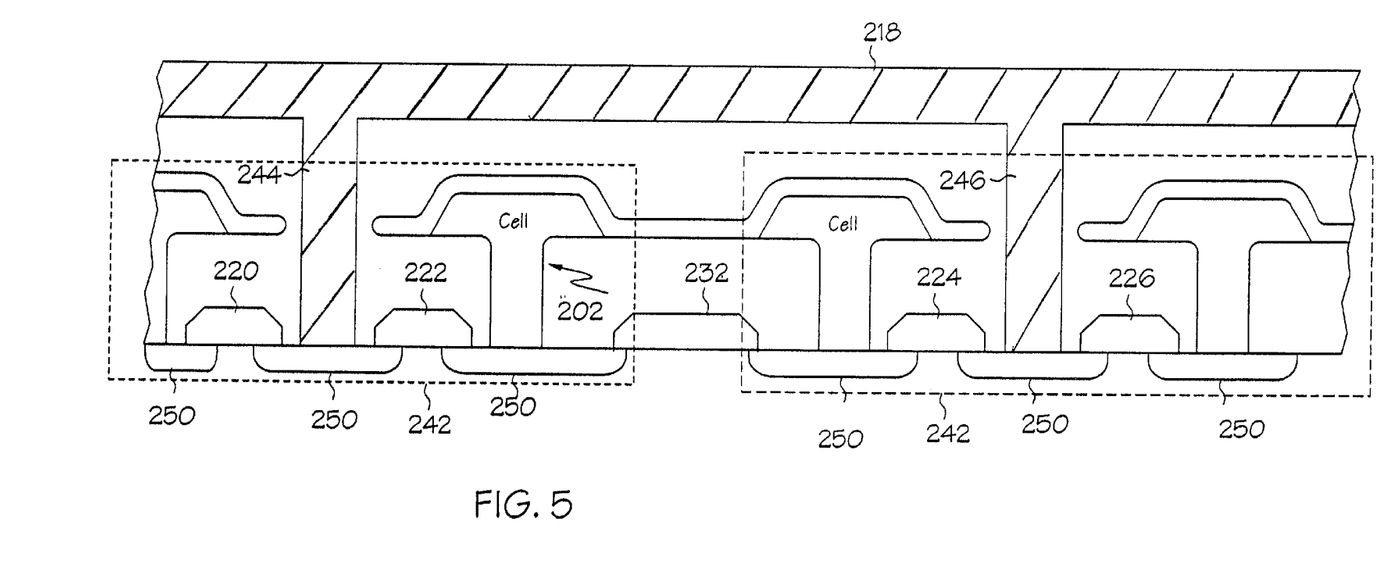
FIG. 5 is an illustration of the architecture cross section according to the present invention.

It is possible to isolate memory cells by forming trenched isolation regions between adjacent devices. Such trenched isolation regions will generally comprise a trench or cavity formed within the substrate and filled with an insulative material, such as silicon dioxide. Further, isolation may be achieved by forming islands of active area or deposits of field oxide. The field oxide acts as a parasitic transistor between the adjacent cells with a large Vt. However, these techniques may be difficult to implement. For example, it is difficult to print islands of active area. FIG. 4 illustrates a layout view of the circuit of FIG. 3. As such, like elements are illustrated with like reference numerals. The memory cells 202 are arranged in memory cell pairs 242. Within a memory cell pair 242, memory cell transistors within a pair, share a single bitline contact 244, 246 and 248 to bitline 218. The active area 250 is a continuous, weaved line. The active area 250 is illustrated within the region designated with diagonal lines. The gates of isolation transistors are tied to the reference voltage Viso 240. The isolation transistors couple adjacent memory cell pairs 242. Further, the transistor in each memory cell 202 connects to a unique wordline 220, 222, 224, 226, 228 and 230. Referring to FIG. 5, like elements are illustrated with like reference numerals. Isolation transistors 232 provide isolation between memory cell pairs 242. Wordlines 220, 222, 224, 226 run perpendicular to the active area 250 in straight strips of polysilicon. The isolation transistors 232 eliminate one and two dimensional encroachment problems associated with normal isolation processes. Furthermore, many photolithography problems are eliminated from the DRAM process as a result of the straight, simple design of both the active area 250 and polysilicon in the memory cell 202. However, it is possible for the isolation transistor 232 to suffer from slight to extreme subthreshold leakage (subVt). The subthreshold leakage can cause data to become corrupted in one or even both of the adjacent memory cells 202.

Figure 6:
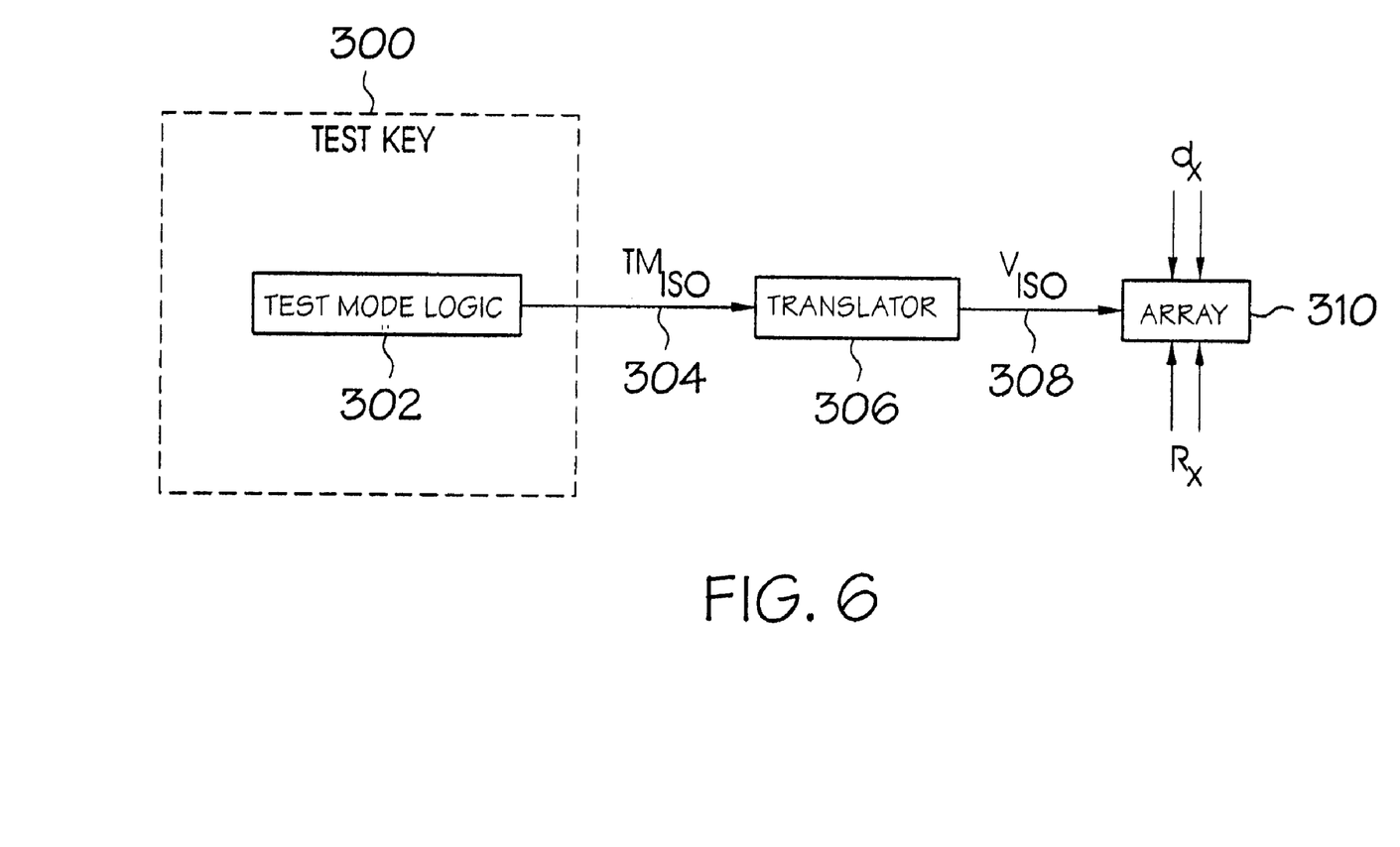
FIG. 6 is a block diagram of the testkey control for the isolation transistor gates of the present invention.

Referring to FIG. 6, a test key 300 is comprised of test mode logic 302. A control signal TMiso 304 couples the test mode logic 302 to a translator 306. The translator couples output signal Viso 308 to the memory array 310, and more particularly to the gate of isolation transistors (not shown in FIG. 6), as described herein. Using a testkey 300 internal to the chip to be used during testing purposes only, the voltage on the gate of an isolation transistor in a memory array 310 can be switched from ground or zero volts to some more negative voltage, for example the back bias voltage (Vbb). Applying a voltage to the gate of the isolation transistor which is more negative than ground will turn the isolation transistor off harder to help turn off the subthreshold leakage path. Vbb is a voltage that is more negative than ground. For example, a typical back bias voltage can range from between −1 to −1.5 volts. The testkey 300 is capable of determining whether the leakage in a given isolation transistor exceeds design parameters. Further, the testkey 300 allows the testing of different isolation gate voltages on the fly, without the need to tape out a reticle to change the tested gate voltage. Changing voltages on the fly means that the testkey 300 can instruct the translator 306 to modify the isolation gate voltage, and the translator 306 will modify the isolation gate voltage, without requiring any modifications to the circuit layout.

The test mode logic 302 performs a series of tests on a given memory array 310 in a semiconductor die, during the testing process of the memory chip. The test mode logic 302 can be used to determine whether the subthreshold leakage of a given isolation transistor is outside predetermined parameters through a series of read, write and compare operations. Any technique can be utilized to determine subthreshold leakage without departing from the present invention. The testkey 300 allows for on chip testing of the memory array 310, including isolation transistors, by applying varying isolation gate voltages on the fly without having to tape out a reticle just to change the isolation gate voltage. Further, changing the isolation transistor gate voltage with a testkey 300 allows for a fair comparison of data collected from the same memory array 310. To correct the leakage, the testkey 300 can change the voltage on the gate of the isolation transistor from ground to Vbb, or some other more negative voltage using translator 306. Since Vbb is more negative than ground, the isolation transistor is turned off harder. The translator 306 serves the function of converting a control signal TMiso 304 supplied by the test logic 302, to an output signal Viso 308, which is used as an isolation gate voltage.

Figure 7:
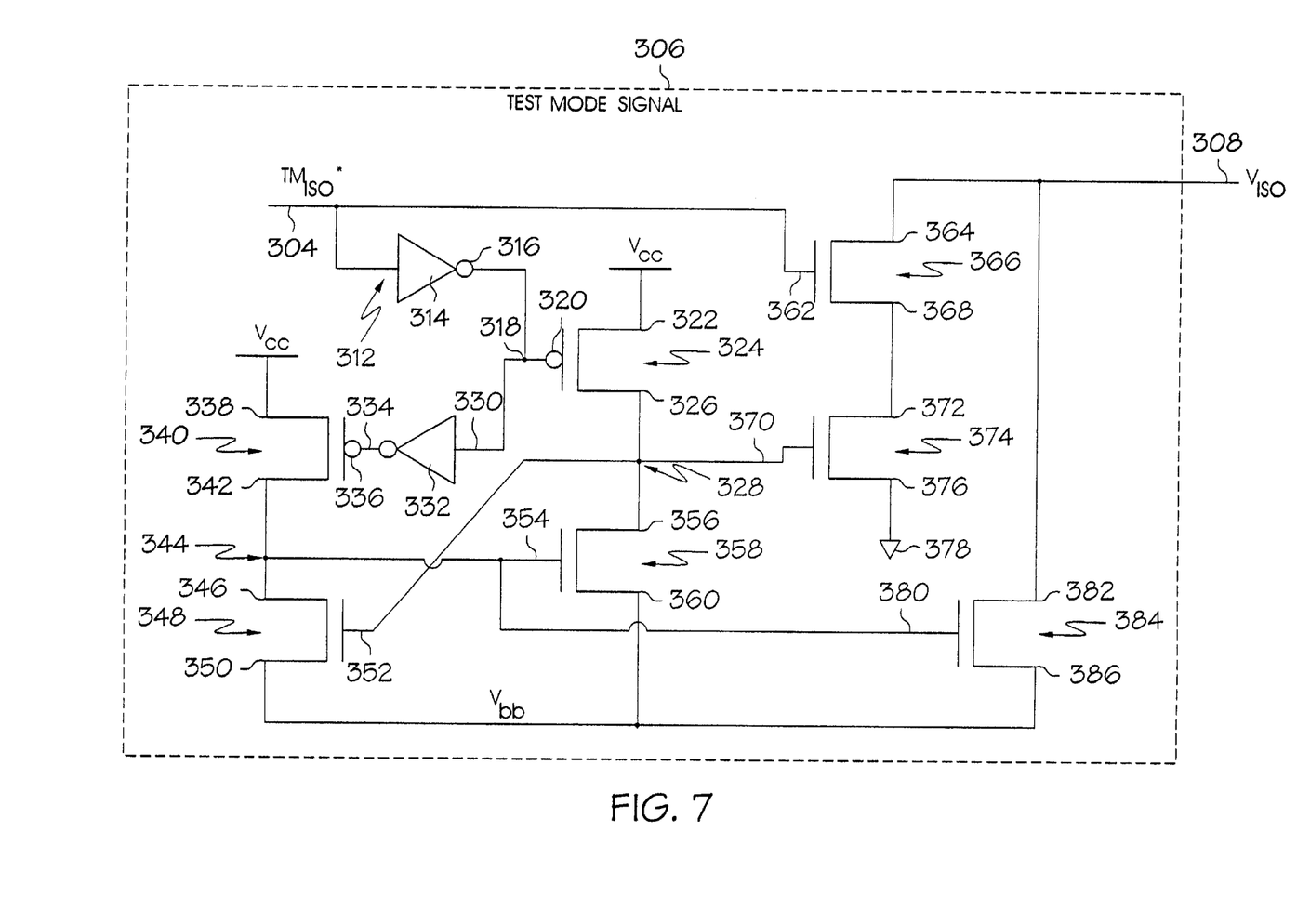
FIG. 7 is a schematic illustration of the translator circuit according to the present invention.

Referring to FIG., 7, the design of the translator 306 is described in greater detail. It should be appreciated that the fundamental purpose of the translator 306 is to take a control signal TMiso 304, from the test circuit, and output a signal capable of properly biasing isolation gates in a memory array. As such, the following description is intended to be an illustration of one possible embodiment. Other designs are possible without departing from the spirit of the present invention.

The translator 306 will be first described when the control signal TMiso 304 is low, or a logic 0. As illustrated in FIG. 7, the control signal TMiso 304 utilizes an active low signal to take output signal Viso 308 to Vbb. The control signal TMiso 304 connects both to the input 312 of the first inverter 314, and to the gate 362 of the first transistor 366. The first transistor 366 is turned off isolating the output signal Viso 308 from the ground 378. It should be observed that the ground 378 is coupled to the output signal Viso 308 through the source/drain 364, 368 of the first transistor 366, and the source/drain 372, 376 of the second transistor 374. If either of the first or second transistors 366, 374 are turned off, the ground 378 will be isolated from the output signal Viso 308.

The output 316 of the first inverter 314 feeds into the first node 318, which connects to both the gate 320 of the third transistor 324, and the input 330 of the second inverter 332. The output 316 is high, which turns off the third transistor 324, and sets the output 334 of the second inverter 332 to low. The low signal at the output 334 of the second inverter 332 feeds the gate 336 of the fourth transistor 340. This low signal turns on the fourth transistor 340, which connects the second node 344 to Vcc through the source/drain 338, 342 of the fourth transistor 340. By applying Vcc to the second node 344, the gate 354 of the fifth transistor 358 is high, which turns on the fifth transistor 358. When the fifth transistor 358 is on, the third node 328 is tied to Vbb through the source/drain 356, 360 of the fifth transistor 358. Vbb is a back bias voltage. Typically, Vbb is a voltage more negative than ground, for example, −1.0 to −1.5 volts. When the third node 328 goes to Vbb, the second transistor 374 turns off further isolating output signal Viso 308 from the ground 378. Further, the sixth transistor 348 is turned off by applying Vbb to the gate 352 of the sixth transistor 348. Finally, Vcc at the second node 344 turns on the seventh transistor 384, connecting the output signal Viso 308 to Vbb through the source/drain region 382, 386 of the seventh transistor 384. Accordingly, under this arrangement, when the control signal TMiso 304 is low, the translator 306 will provide an isolation gate voltage of Vbb, or the back bias voltage at output signal Viso 308.

Now, if the control signal TMiso 304 is set to a logic 1, then the input 312 of the first inverter 314 is high, and the output 316 of the first inverter 314 goes low. Accordingly, the first node 318 is low, which sets the output 334 of the second inverter 332 to a high level. This turns off the fourth transistor 340, isolating the second node 344 from Vcc through the source/drain 338, 342 of the fourth transistor 340. Further, when the first node 318 is low, the third transistor 324 turns on, coupling Vcc to the third node 328 through the source/drain 322, 326 of the third transistor 324. When the third node 328 is raised to Vcc, the gate 352 of the sixth transistor 348 turns on, coupling the second node 344 to Vbb through the source/drain 346, 350 of the sixth transistor 348. When the second node 344 transitions to Vbb, a voltage more negative than ground, the fifth transistor 358 turns off isolating the third node 328 from Vbb. Further, the seventh transistor 384 turns off isolating Vbb from the output signal Viso 308. The control signal TMiso 304 turns on the first transistor 366. Further, Vcc applied to the third node 328, through the source/drain 322, 326 of the third transistor 324 turns on the second transistor 374. With both the first and second transistors 366, 374 turned on, the ground 378, or zero volts, is coupled to the output signal Viso 308 through the source/drain 372, 376 of the second transistor 374, and through the source/drain 364, 368 of the first transistor 366. Accordingly, when the control signal Tmiso 304 is high, the output signal Viso 308 of the translator 306 is tied to ground, or zero volts.

Referring back to FIG. 3, it should be clear that the isolation transistors 232 which separate adjacent memory cells 202 tied to the bitline 218 must be off to avoid coupling of data from one memory cell to the next. The gate of the isolation transistors must be tied to ground, or alternatively some negative potential to effectively turn off the isolation transistors 232. While satisfactory performance is generally obtained by tying the gate of the isolation transistor 232 to ground, there are certain occasions where it is necessary to turn the transistor off harder. Where the testkey determines that the isolation transistor 232 being tested exceeds the parameters for acceptable subthreshold leakage, the gates of such isolation transistors 232 can be tied permanently to Vbb through the control signal Viso 240.

It should be appreciated that the present invention is scalable in practice. For example, the present invention illustrates each isolation transistor 232 along a single bitline 218 tied to the same isolation gate voltage Viso 240. Alternatively, each isolation gate 238 could be individually programmed, or alternatively, the gates 238 of select isolation transistors 232 can be tied together. The grouping of isolation transistors selected may vary from application to application and depend upon such factors as the degree of sophistication of the test mode logic, as well as the die size and density requirements of the chip.

Figure 8:
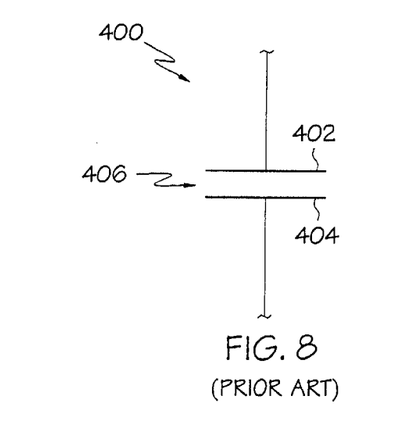
FIG. 8 is a schematic illustration of a prior art antifuse.

Referring to FIG. 6, once the translator output signal Viso 308 has been determined to minimize subthreshold leakage, the isolation gate voltage may be permanently programmed using any known programming techniques. One such circuit element suited to program an output voltage is an antifuse. Referring to FIG., 8, an antifuse 400, is a circuit element useful for providing selective one time programmable permanent electrical connections between circuit nodes. An antifuse 400 can be implemented with a structure similar to that of a capacitor. In its default state, two conductive terminals 402, 404 are separated by a dielectric layer 406. This provides a high resistance between the antifuse terminals 402, 404, resulting in an "off" state without programming. The antifuse 400 can be programmed to an "on" state by applying a large programming voltage across the antifuse terminals 402, 404. Upon the application of a large voltage, the dielectric 406 breaks down forming conductive pathways between the antifuse terminals 402, 404. The conductive pathways effectively lower the antifuse 400 resistance. Once programmed however, the antifuse 400 cannot be programmed back to an off state.

Figure 9:
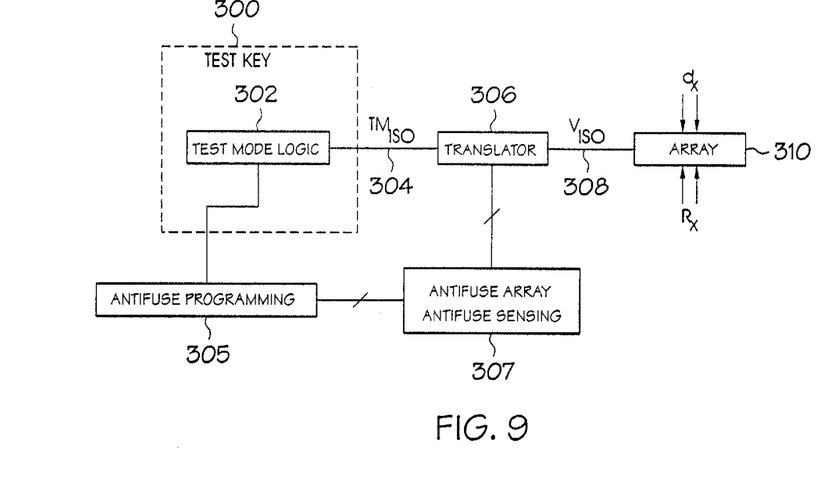
FIG. 9 is a block diagram of the testkey control for the isolation transistor gates of the present invention, incorporating an antifuse device to program the selected isolation gate voltage for operation outside of a test mode; and, FIG. 10 is a block diagram of the testkey control for the isolation transistor gates of the present invention, incorporating an antifuse device to program the selected isolation gate voltage for operation outside of a test mode, a sensing device to read the state of the antifuses, and a plurality of isolation gate voltages.

Referring to FIG. 9, the antifuse array 307 coordinates with the testkey 300 to ensure that after testing has completed, the gate of the isolation transistor is tied to the appropriate voltage. It should be appreciated by those skilled in the art that the antifuse array 307 can be implemented in any number of ways without departing from the spirit of the present invention. For example, the antifuse array 307 can provide a control signal to the translator 306 that is considered by the translator 306 in conjunction with the control signal TMiso 304 sent by the test mode logic 302 using combinational logic. The antifuse array 307 may optionally be arranged serially between the test mode logic 302 and the translator 306. An alternative is to condition the translator 306 to determine the value of the isolation gate voltage output from the antifuse array 307 solely, once the die has left testing mode. Under this arrangement, the test mode logic 302 controls the translator 306 while the memory device is in a testing mode, and the antifuse array 307 controls the translator 306 while the memory device is in normal operation. It should be appreciated that the test mode logic 302, as well as the translator 306 are implemented internal to the semiconductor die.

Figure 10:
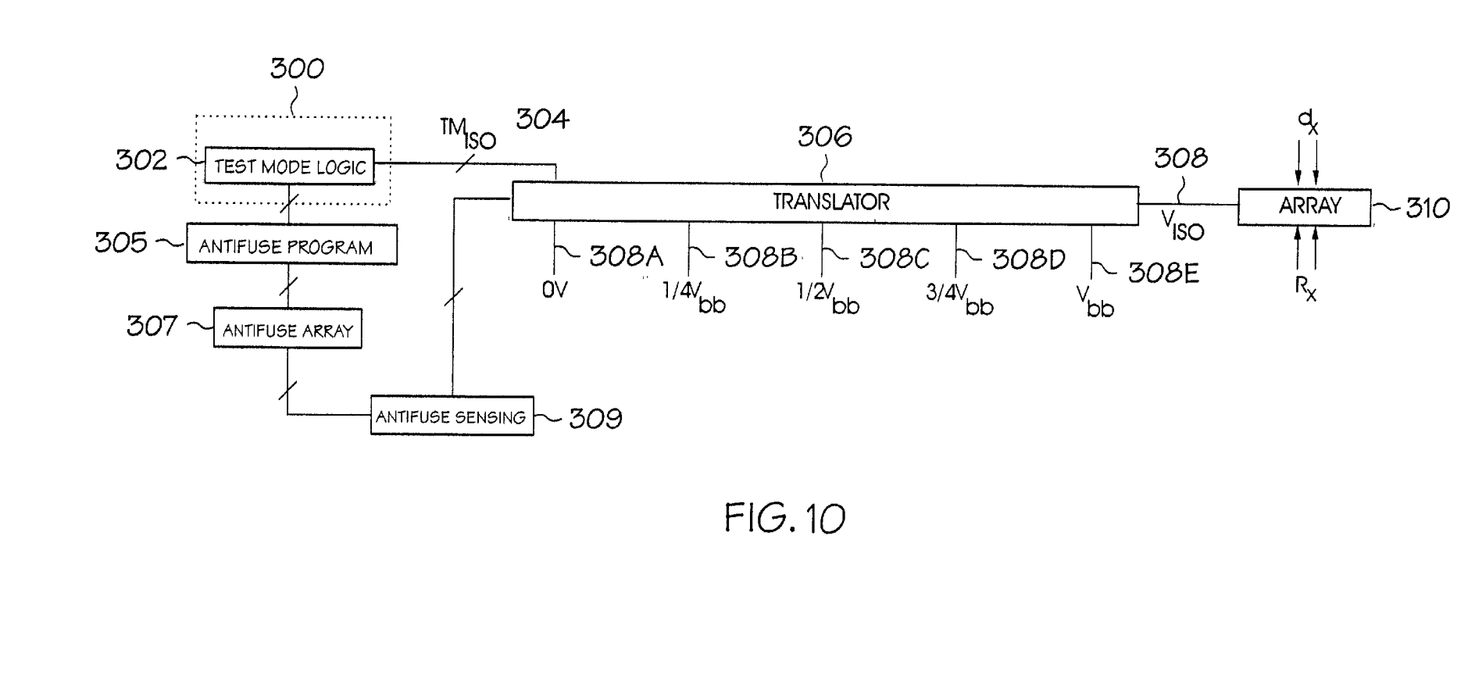

Referring to FIG. 10, the testkey 300 is capable of testing the isolation characteristics including subthreshold leakage of the isolation transistors of a memory array 310. In this testing arrangement, the chip, preferably in bare semiconductor die form is placed in a test mode where other memory device characteristics may also optionally be tested. The translator 306 is capable of supplying a plurality of isolation gate voltages 308A, 308B, 308C, 308D, 308E. The voltages range from 0 volts 308A, to Vbb 308E, and further provide incremental steps of ¼ Vbb 308B, ½ Vbb 308C and ¾ Vbb 308D. It should be appreciated by those skilled in the art that although illustrated in increments of ¼ of Vbb, any number of increments can be utilized within the spirit of the invention. Further, while the translator 306 is illustrated to output an isolation gate bias voltage between 0 and Vbb, additional voltage ranges may be selected, so long as the entire voltage range is biased to turn off the isolation transistor. For example, an option can be provided for a voltage more negative that Vbb. The testkey 300 is internal to the chip and is used only in test mode. The testkey 300 checks the isolation characteristics of the isolation transistors. Where the subthreshold leakage exceeds a predetermined parameter, the testkey 300 changes the voltage on the gate of the isolation transistors to some voltage more negative than 0 volts by sending a control signal TMiso 304 from the test mode logic 302 to the translator 306. The translator 306 interprets the control signal TMiso 304, and generates the appropriate isolation gate voltage, or output signal Viso 308. Where the isolation transistor fails to meet the testkey 300 parameters, the testkey 300 may change the voltage to the isolation gates to some voltage more negative than ground. The testkey 300 may select the next voltage, or select from any of the available voltages, and repeat the tests. For example, where the isolation transistor fails with a gate voltage at 0 volts, the testkey 300 may optionally move to the next lowest voltage, ¼ Vcc, or jump to any negative voltage, ¾ Vbb for example. It should be appreciated by those skilled in the art that each incremental voltage provided, which is more negative than ground will turn the isolation transistor off harder to help stop turn off the subthreshold leakage path. Once the testkey 300 has determined a suitable isolation gate voltage, a programming device such as an antifuse 307 may be used to permanently program the output signal Viso 308.

While the antifuse array 307 defines a circuit element particularly suited to the present application, it should be understood by those skilled in the art that other suitable circuit elements may be used within the spirit of the present invention including fuses. Further, while a single isolation gate voltage was applied to all isolation transistors along a single bitline, it should be appreciated by those skilled in the art that the present invention is scalable to meet any design requirements. For example, a single isolation gate voltage may be applied to isolation transistors for a plurality of bitlines, or alternatively be applied to isolation transistors in a configuration something less than an entire bitline.

The test key 300 can be programmed to bypass the antifuse array 307 and selectively apply different voltages 308A, 308B, 308C, 308D, 308E to the translator output Viso 308. As illustrated in FIG. 10, test key 300 is programming is carried out using test mode logic 302. The output signal Viso 308 is applied to the gates of isolation transistors in the memory array 310, until leakage is controlled. Once the proper voltage 308A, 308B, 308C, 308D, 308E is determined, the antifuse array 307 is programmed by the antifuse programming circuit 305. The antifuse array 307 is arranged to control the translator output signal Viso 308 when the semiconductor chip is not in a testing mode. While not required to practice the present invention, depending upon the design of the antifuse array 307, and depending upon the interface of the antifuse array 307 to the translator, it may prove beneficial to include an antifuse sensing circuit 309. The antifuse sensing circuit 309 determines the state of the antifuse array 307 and communicates with the translator 306.

Having described the invention in detail and by reference to preferred embodiments thereof, it will be apparent that modifications and variations are possible without departing from the scope of the invention defined in the appended claims.

What is claimed is:

1. A memory device having improved subthreshold leakage characteristics comprising:
    a first memory cell;
    a second memory cell;
    an isolation device arranged to reduce leakage between said first and second memory cells, said isolation device having an isolation control; and
    a translator circuit coupled to said isolation control, said translator circuit programmably configured to couple said isolation control to a select one of at least two bias signals.

2. The memory device having improved subthreshold leakage characteristics according to claim 1, wherein said at least two bias signals comprise first and second bias signals, said second bias signal arranged to prevent leakage between said first and second memory cells more effectively than said first bias signal.

3. The memory device having improved subthreshold leakage characteristics according to claim 1, wherein said at least two bias signals comprise at least a first voltage at ground potential, and a second voltage more negative than said first voltage.

4. The memory device having improved subthreshold leakage characteristics according to claim 3, wherein said second voltage comprises a back bias voltage.

5. The memory device having improved subthreshold leakage characteristics according to claim 1, wherein said isolation device comprises a transistor positioned between said first and second memory cells and said isolation control comprises a gate of said transistor.

6. A memory device having improved subthreshold leakage characteristics comprising:
  a first memory cell;
  a second memory cell;
  an isolation device arranged to reduce leakage between said first and second memory cells, said isolation device comprising an isolation control that is coupled to a select one of at least two bias signals, and
  an antifuse programmable to select the one of said at least two bias signals that is coupled to said isolation control.

7. The memory device having improved subthreshold leakage characteristics according to claim 6, wherein said at least two bias signals comprise at least a first voltage at ground potential, and a second voltage more negative than said first voltage.

8. The memory device having improved subthreshold leakage characteristics according to claim 6, wherein said Isolation device comprises a transistor positioned between said first and second memory cells and said isolation control comprises a gate of said transistor.

9. A memory device having improved subthreshold leakage characteristics comprising:
  a first memory cell;
  a second memory cell;
  a testkey; and
  an isolation device arranged to reduce leakage between said first and second memory cells, wherein said isolation device Is coupled to said testkey and is controlled by a select one of at least two bias signals.

10. The memory device having improved subthreshold leakage characteristics according to claim 9, wherein said testkey is arranged to change on the fly, which of said at least two bias signals control said isolation device.

11. The memory device having improved subthreshold leakage characteristics according to claim 10, wherein said testkey is further arranged to obtain measured subthreshold leakage values of said isolation device when said isolation device Is coupled to different ones of said at least two bias signals.

12. The memory device having improved subthreshold leakage characteristics according to claim 11, wherein said testkey Is further arranged to compare measured subthreshold leakage values of said isolation device to a predetermined subthreshold leakage value when said isolation device is coupled to different ones of said at least two bias signals, and permanently program said isolation device to a select one of said at least two bias signals based upon the comparisons.

13. The memory device having improved subthreshold leakage characteristics according to claim 11, wherein said testkey is arranged to couple said isolation device to said different ones of said at least two bias signals only when in a test mode.

14. The memory device having improved subthreshold leakage characteristics according to claim 9, further comprising a translator coupled between said testkey and said isolation device, said translator arranged to set said at least two bias signals.

15. The memory device having improved subthreshold leakage characteristics according to claim 14, wherein said translator comprises a circuit arranged to couple said isolation device to a select one of said at least two bias signals.

16. The memory device having improved subthreshold leakage characteristics according to claim 14, further comprising at least one antifuse coupled to said translator, said at least one antifuse programmable to permanently couple a select one of said at least two bias signals.

17. The memory device having improved subthreshold leakage characteristics according to claim 9, wherein said at least two bias signals comprise at least a first voltage at ground potential, and a second voltage more negative than said first voltage.

18. The memory device having improved subthreshold leakage characteristics according to claim 9, wherein said isolation device comprises a transistor positioned between said first and second memory cells and said isolation control comprises a gate of said transistor.

19. A memory device having improved subthreshold leakage characteristics comprising:
  a first memory cell;
  a second memory cell;
  an isolation device having an Isolation control that is controlled by a select one of at least two bias signals, said isolation device arranged to reduce leakage between said first and second memory cells;
  a testkey;
  a translator having a bias control output coupled to said isolation control of said isolation device, wherein said bias control output carries the selected one of said at least two bias signals to said isolation device; and
  at least one control signal coupled between said testkey and said translator, wherein said testkey is arranged to program said bias control output of said translator to said select one of said at least two bias signals.

20. The memory device having improved subthreshold leakage characteristics according to claim 19, wherein said at least two bias signals comprise at least a first voltage at ground potential, and a second voltage more negative than said first voltage.

21. The memory device having improved subthreshold leakage characteristics according to claim 19, wherein said isolation device comprises a transistor positioned between said first and second memory cells and said isolation control comprises a gate of said transistor.

22. A memory device having improved subthreshold leakage characteristics comprising:
  a first memory cell comprising:
    a first transistor having a first source/drain region coupled to a bitline, a gate coupled to a first wordline, and a second source/drain region; and
    a first capacitor coupling a reference voltage to said second source/drain region;
  a second memory cell comprising:
    a second transistor having a first source/drain region coupled to said bitline, a gate coupled to a second wordline, and a second source/drain region; and a second capacitor coupling a reference voltage to said second source/drain region;

an isolation transistor having a first source/drain region coupled to said second source/drain region of said first memory cell, a second source/drain region coupled to said second source/drain region of said second memory cell, and an isolation transistor gate; and a translator circuit coupled to said isolation transistor gate, said translator circuit programmably configured to couple said isolation transistor gate to a select one of at least two voltages, each of said at least two voltages arranged to turn off said isolation transistor.

23. The memory device having improved subthreshold leakage characteristics according to claim 22, wherein said at least two voltages comprise first and second voltages, said second voltage arranged to prevent leakage between said first and second memory cells more effectively than said first voltage.

24. A memory device having improved subthreshold leakage characteristics comprising:

a first memory cell comprising:
a first transistor having a first source/drain region coupled to a bitline, a gate coupled to a first wordline, and a second source/drain region; and
a first capacitor coupling a reference voltage to said second source/drain region;

a second memory cell comprising:
a second transistor having a first source/drain region coupled to said bitline, a gate coupled to a second wordline, and a second source/drain region; and
a second capacitor coupling a reference voltage to said second source/drain region; and an isolation transistor having a first source/drain region coupled to said second source/drain region of said first memory cell, a second source/drain region coupled to said second source/drain region of said second memory cell, and an isolation transistor gate coupled to a select one of at least two voltages, each of said at least two voltages arranged to turn off said isolation transistor, wherein said isolation transistor gate is further coupled to a testkey that is arranged to change on the fly, which of said at least two voltages couple to said isolation transistor gate.

25. The memory device having improved subthreshold leakage characteristics according to claim 24, wherein said testkey is further arranged to obtain measured subthreshold leakage values of said isolation transistor when said isolation transistor gate is coupled to different ones of said at least two voltages.

26. The memory device having improved subthreshold leakage characteristics according to claim 25, wherein said testkey Is further arranged to compare measured subthreshold leakage values of said Isolation transistor to a predetermined subthreshold leakage value when said isolation transistor gate is coupled to different ones of said at least two voltages, and permanently program said isolation transistor gate to a select one of said at least two voltages based upon the comparisons.

27. A memory device having improved subthreshold leakage characteristics comprising:

a first memory cell comprising:
a first transistor having a first source/drain region coupled to a bitline, a gate coupled to a first wordline, and a second source/drain region; and
a first capacitor coupling a reference voltage to said second source/drain region;

a second memory cell comprising:
a second transistor having a first source/drain region coupled to said bitline, a gate coupled to a second wordline, and a second source/drain region; and
a second capacitor coupling a reference voltage to said second source/drain region;

an isolation transistor having a first source/drain region coupled to said second source/drain region of said first memory cell, a second source/drain region coupled to said second source/drain region of said second memory cell, and an Isolation transistor gate coupled to a select one of at least two voltages, each of said at least two voltages arranged to turn off said isolation transistor;

a testkey;

a translator having a bias control output coupled to said isolation transistor gate said bias control output arranged to couple the selected one of said at least two voltages to said isolation transistor gate; and at least one control signal coupled between said testkey and said translator, wherein said testkey is arranged to program said bias control output of said translator to said select one of said at least two voltages.

28. An isolation device biasing circuit for controlling isolation devices positioned to prevent leakage between adjacent ones of a plurality of memory cells comprising:

a test circuit arranged to determine isolation device characteristics; and a translator coupled between said test circuit and said isolation devices, wherein said test circuit is arranged to program said translator to bias said isolation devices to a select one of at least two bias signals, each of said at least two bias signals arranged to reduce leakage between adjacent memory cells.

29. The isolation device biasing circuit for controlling isolation devices positioned to prevent leakage between adjacent ones of a plurality of memory cells according to claim 28, wherein said at least two bias signals comprise first and second bias signals, said second bias signal arranged to prevent leakage between adjacent ones of a plurality of memory cells more effectively than said first bias signal.

30. The isolation device biasing circuit for controlling isolation devices positioned to prevent leakage between adjacent ones of a plurality of memory cells according to claim 29, wherein said first bias signal comprises a first voltage of ground potential, and said second bias signal comprises a second voltage more negative than said first voltage.

31. The isolation device biasing circuit for controlling isolation devices positioned to prevent leakage between adjacent ones of a plurality of memory cells according to claim 28, wherein said test circuit further comprises a testing mode, wherein and said test circuit is arranged to program said translator to bias said isolation devices while in said testing mode, and hold said translator to bias said isolation devices at a fixed one of said at least two bias signals when said out of said testing mode.

32. The isolation device biasing circuit for controlling isolation devices positioned to prevent leakage between adjacent ones of a plurality of memory cells according to claim 28, further comprising an antifuse array coupled to said translator, said antifuse array being programmable such that once programmed, said translator permanently biases said isolation devices at a fixed one of said at least two bias signals.

33. A memory device having improved subthreshold leakage characteristics comprising:

a plurality of memory cell pairs, each of said memory cell pairs having a first memory cell and a second memory cell;

an isolation device coupled between adjacent memory cell pairs; and a translator circuit programmably configured to output a reference signal that is coupled to each isolation device, said translator circuit programmable to set said reference signal to a select one of at least two bias signals, said reference signal arranged to cause each isolation device to reduce leakage between respective ones of said memory cell pairs.

* * * * *

UNITED STATES PATENT AND TRADEMARK OFFICE
CERTIFICATE OF CORRECTION

PATENT NO. : 6,556,467 B2
DATED : April 29, 2003
INVENTOR(S) : Derner et al.

It is certified that error appears in the above-identified patent and that said Letters Patent is hereby corrected as shown below:

Column 7,
Line 59, reads as "second soured/drain" should read -- second source/drain --.

Column 13,
Line 36, reads as "said Isolation device" should read -- said isolation device --.
Lines 47 and 57, reads as "device Is coupled" should read -- device is coupled --.
Line 61, reads as "testkey Is further" should read -- testkey is further --.

Column 14,
Line 33, reads as "an Isolation control" should read -- an isolation control --.

Column 15,
Line 54, reads as "testkey Is further" should read -- testkey is further --.
Line 55, reads as "said Isolation transistor" should read -- said isolation transistor --.

Column 16,
Line 13, reads as "an Isolation transistor" should read -- an isolation transistor --.

Signed and Sealed this

Fifteenth Day of July, 2003

JAMES E. ROGAN
*Director of the United States Patent and Trademark Office*